United States Patent
Bao

(10) Patent No.: US 8,040,166 B2
(45) Date of Patent: Oct. 18, 2011

(54) FREQUENCY MULTIPLIER

(75) Inventor: Mingquan Bao, Vastra Frolunda (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 0 days.

(21) Appl. No.: 12/997,957

(22) PCT Filed: Jun. 16, 2008

(86) PCT No.: PCT/SE2008/050716
§ 371 (c)(1), (2), (4) Date: Dec. 14, 2010

(87) PCT Pub. No.: WO2009/154521
PCT Pub. Date: Dec. 23, 2009

(65) Prior Publication Data
US 2011/0095792 A1    Apr. 28, 2011

(51) Int. Cl.
*H03B 19/00*    (2006.01)
(52) U.S. Cl. ........................ 327/119; 455/333
(58) Field of Classification Search .......... 327/355–361, 327/113, 119–120; 455/326, 333
See application file for complete search history.

(56) References Cited

U.S. PATENT DOCUMENTS

| | | | |
|---|---|---|---|
| 5,815,014 A * | 9/1998 | Zhang et al. | 327/122 |
| 6,124,742 A | 9/2000 | Cook et al. | |
| 7,596,364 B2 * | 9/2009 | Sjoland | 455/341 |
| 2006/0145737 A1 | 7/2006 | Yamamoto et al. | |
| 2011/0001540 A1 * | 1/2011 | Bao | 327/355 |

FOREIGN PATENT DOCUMENTS
EP    0487386    5/1992
GB    1093913    12/1967

\* cited by examiner

*Primary Examiner* — Dinh T. Le
(74) *Attorney, Agent, or Firm* — Rothwell, Figg, Ernst & Manbeck, P.C.

(57) ABSTRACT

In one aspect, the present invention provides a frequency multiplier. In some embodiments, the frequency multiplier includes: a first transistor and a second transistor, wherein a first terminal of the first transistor is connected to a third terminal of the second transistor through a first capacitor, and a first terminal of the second transistor is connected to a third terminal of the first transistor through a second capacitor. The frequency multiplier may also include a balun, wherein the third terminal of the first transistor is connected to a terminal of the balun, and the third terminal of the second transistor is connected to a different terminal of the balun.

13 Claims, 3 Drawing Sheets

FREQUENCY MULTIPLIER

CROSS REFERENCE TO RELATED APPLICATION(S)

This application is a 35 U.S.C. §371 National Phase Entry Application from PCT/SE2008/050716, filed Jun. 16, 2008 designating the United States, the disclosure of which is incorporated herein in its entirety by reference.

TECHNICAL FIELD

The present invention relates generally to frequency multipliers.

BACKGROUND

Frequency multipliers are often used in microwave/millimeter-wave signal sources. A frequency multiplier can up-convert a relatively low frequency signal into a high frequency signal. Drawbacks exist with conventional frequency multipliers. For example, some conventional frequency multipliers have a low conversion gain and a limited operating frequency, while others consume large amounts of power and require a relatively high supply voltage. What is desired is a frequency multiplier that overcomes at least some of these disadvantages.

SUMMARY

In one aspect, the present invention provides a frequency multiplier that overcomes at least some of the above mentioned disadvantages. In some embodiments, the frequency multiplier includes: a first transistor having a first terminal, a second terminal and a third terminal; and a second transistor having a first terminal, a second terminal and a third terminal, wherein the first terminal of the first transistor is connected to the third terminal of the second transistor through one or more circuit elements, said one or more circuit elements including a first capacitor, and the first terminal of the second transistor is connected to the third terminal of the first transistor through one or more circuit elements, said one or more circuit elements including a second capacitor.

In some embodiments, the frequency multiplier also includes a balun, wherein the third terminal of the first transistor is connected to a first terminal of the balun, and the third terminal of the second transistor is connected to a second terminal of the balun.

The second terminal of the first transistor may be connected to an output node and the second terminal of the second transistor may also be connected to the output node. The transistor may be implemented using bipolar junction transistors or other transistors.

Accordingly, in some embodiments, the first terminal of the first transistor is the base of the first transistor, the first terminal of the second transistor is the base of the second transistor, the second terminal of the first transistor is the collector of the first transistor, the second terminal of the second transistor is the collector of the second transistor, the third terminal of the first transistor is the emitter of the first transistor, and the third terminal of the second transistor is the emitter of the second transistor.

In some embodiments, the frequency multiplier also includes a third capacitor, wherein the third terminal of the first transistor is connected to the third terminal of the second transistor through the third capacitor. In some embodiments, the first terminal of the first transistor and the first terminal of the second transistor are biased at a turn-on voltage.

In another aspect, the present invention provides a frequency multiplier method for use in a frequency multiplier circuit comprising a first transistor having a first terminal, a second terminal and a third terminal and a second transistor having a first terminal, a second terminal and a third terminal. In some embodiments, the method includes: merging the frequency multiplier circuit with a balun; and simultaneously applying at each transistors' first and third terminals anti-phase RF signals.

In some embodiments, each transistor is a bipolar junction transistor (BJT), and the first terminal of the first transistor is the base of the first transistor, the first terminal of the second transistor is the base of the second transistor, the second terminal of the first transistor is the collector of the first transistor, the second terminal of the second transistor is the collector of the second transistor, the third terminal of the first transistor is the emitter of the first transistor, and the third terminal of the second transistor is the emitter of the second transistor. In some embodiments, the first terminal of the first transistor and the first terminal of the second transistor are biased at a turn-on voltage.

In some embodiments, the method also includes capacitively coupling the first transistor with the second transistor to form a capacitive coupled transistor pair. In some embodiments, the step of capacitively coupling the first transistor with the second transistor comprises: connecting the first terminal of the first transistor to the third terminal of the second transistor through one or more circuit elements, said one or more circuit elements including a first capacitor; and connecting the first terminal of the second transistor to the third terminal of the first transistor through one or more circuit elements, said one or more circuit elements including a second capacitor.

In some embodiments, the method includes: capacitively coupling the first transistor with the second transistor to form a capacitive coupled transistor pair; and simultaneously applying at each said transistors first and third terminals anti-phase RF signals.

The above and other aspects and embodiments of the present invention are described below with reference to the accompanying drawings.

BRIEF DESCRIPTION OF THE DRAWINGS

The accompanying drawings, which are incorporated herein and form part of the specification, illustrate various embodiments of the present invention. In the drawings, like reference numbers indicate identical or functionally similar elements.

DETAILED DESCRIPTION

In a frequency multiplier according to some embodiments of the invention, the frequency multiplier includes two bipolar junction transistors and anti-phase RF signals are applied simultaneously at each transistor's base and emitter. Thus, the RF signal swing across the transistors' base-emitter is larger than that in the conventional frequency multipliers. Consequently, a high conversion gain is possible. Furthermore, in some embodiments, the frequency multiplier is merged with a passive balun. Thus, the whole circuit can be compact.

Figure 1:
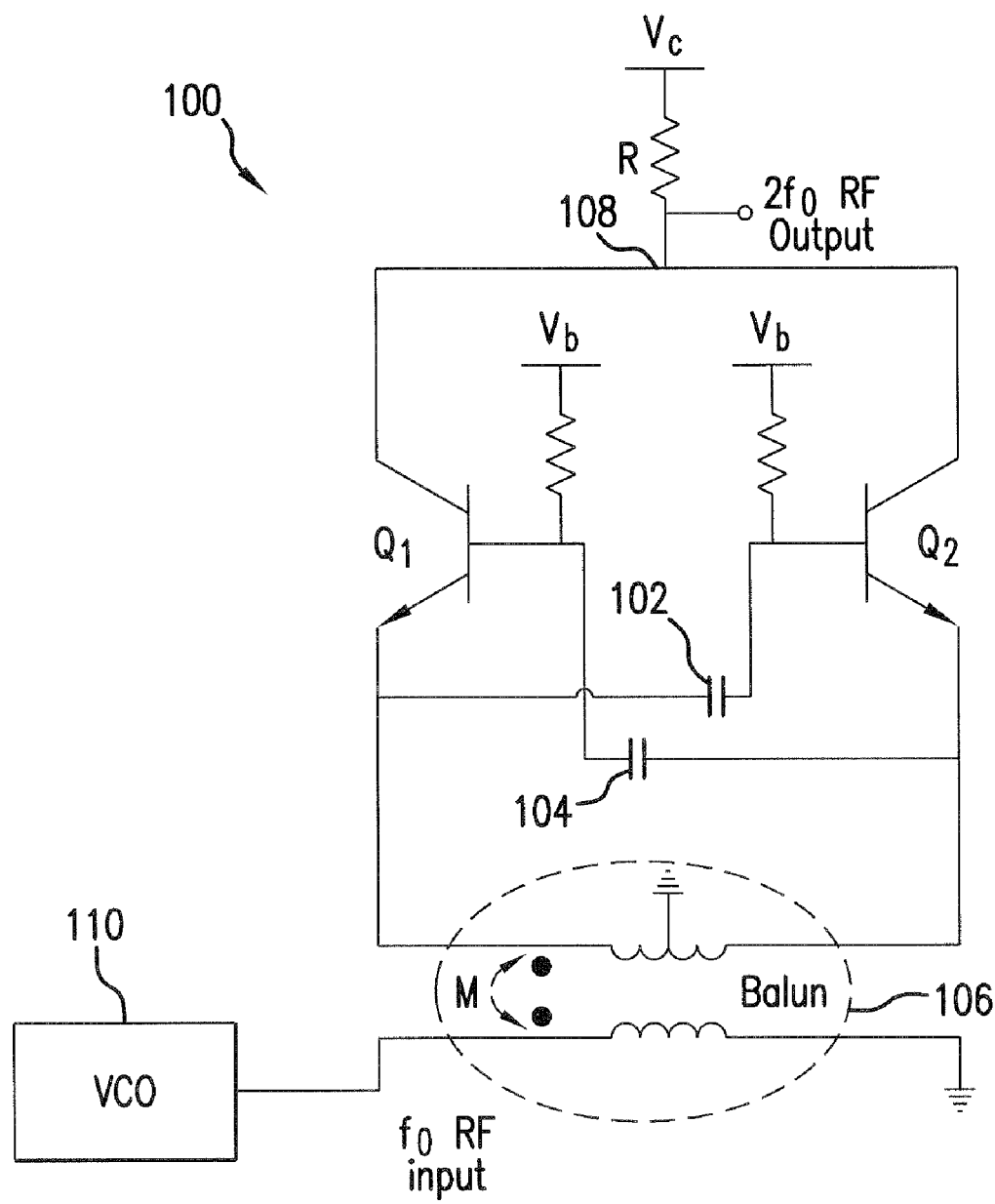
FIG. 1 is circuit diagram illustrating a frequency multiplier according to some embodiments of the invention.

Referring now to FIG. 1, FIG. 1 is circuit diagram illustrating a frequency multiplier 100 according to some embodiments of the invention. As illustrated in FIG. 1, frequency multiplier 100 may be used to multiply the frequency of a signal produced by a signal generator 110 (e.g., a voltage controlled oscillator (VCO)) or other signal generator).

As shown in FIG. 1, frequency multiplier 100 includes a capacitive cross-coupled transistor pair (Q1 and Q2) and a passive balun 106 for providing differential signals for the transistor pair. For example, the base of transistor Q1 is connected to the emitter of transistor Q2 via capacitor 104, and, likewise, the base of transistor Q2 is connected to the emitter of transistor Q1 via capacitor 102. While transistor Q1 and Q2 are illustrated as being biplor junction transistors, this was done solely for the sake of illustration. Thus, the invention is not limited to any particular type of transistor.

As further illustrated in FIG. 1, the collectors of Q1 and Q2 are connected to an output node 108 where a high frequency RF signal is taken out, and Q1's emitter and Q2's base are connected with the balun's balanced output. Therefore, the anti-phase RF signal via the balun is added at both base and emitter of each transistor Q1 and Q2.

In contrast, in conventional frequency multipliers, the differential RF signal is added at the base of two transistors, but their emitters are connected to an ac virtual ground. Therefore, its RF signal's swing across base and emitter is less that of frequency multiplier 100. Thus, frequency multiplier 100 is superior to the prior multipliers in terms of conversion gain.

In addition, the impedance of the second coil of balun 106 acts as emitter degeneration, which provides a negative feedback for the transistors. It enables the conversion gain to be insensitive to the input RF power. In other words, the conversion gain can be kept constant within a certain range of RF input power.

To improve conversion gain, the base of each transistor is biased at turn-on voltage. For example, as shown in FIG. 1, the base of Q1 is connected to voltage source Vb through a resistor and the base of Q2 is also connected to voltage source Vb through a resistor. Accordingly, transistor Q1 and Q2 are turned-on only within half-period alternatively. This results in a high efficiency which is defined as the ratio of output RF power to dc power consumption.

Passive balun 106 provides differential RF signals for the capacitive coupled transistor pair. At the output point, the odd-order harmonics are added in anti-phase, while, the even-order harmonics are in-phase. Thus, the even harmonics, especially the second harmonic, are dominated, and the odd harmonics are suppressed. The suppression of the odd harmonics, especially the fundamental component, is determined by the performance of the balun, symmetry of layout, etc. However, the cross-coupled transistor pair has a function of actively compensating for certain unbalance existing at the output of the passive balun, i.e., improves the fundamental signal's balance at two transistor's collectors, therefore, it helps to achieve better fundamental suppression.

Frequency multiplier 100 has a wide frequency bandwidth which is determined by the passive balun and the capacitors 102 and 104, the capacitance of which may be equal.

Figure 2:
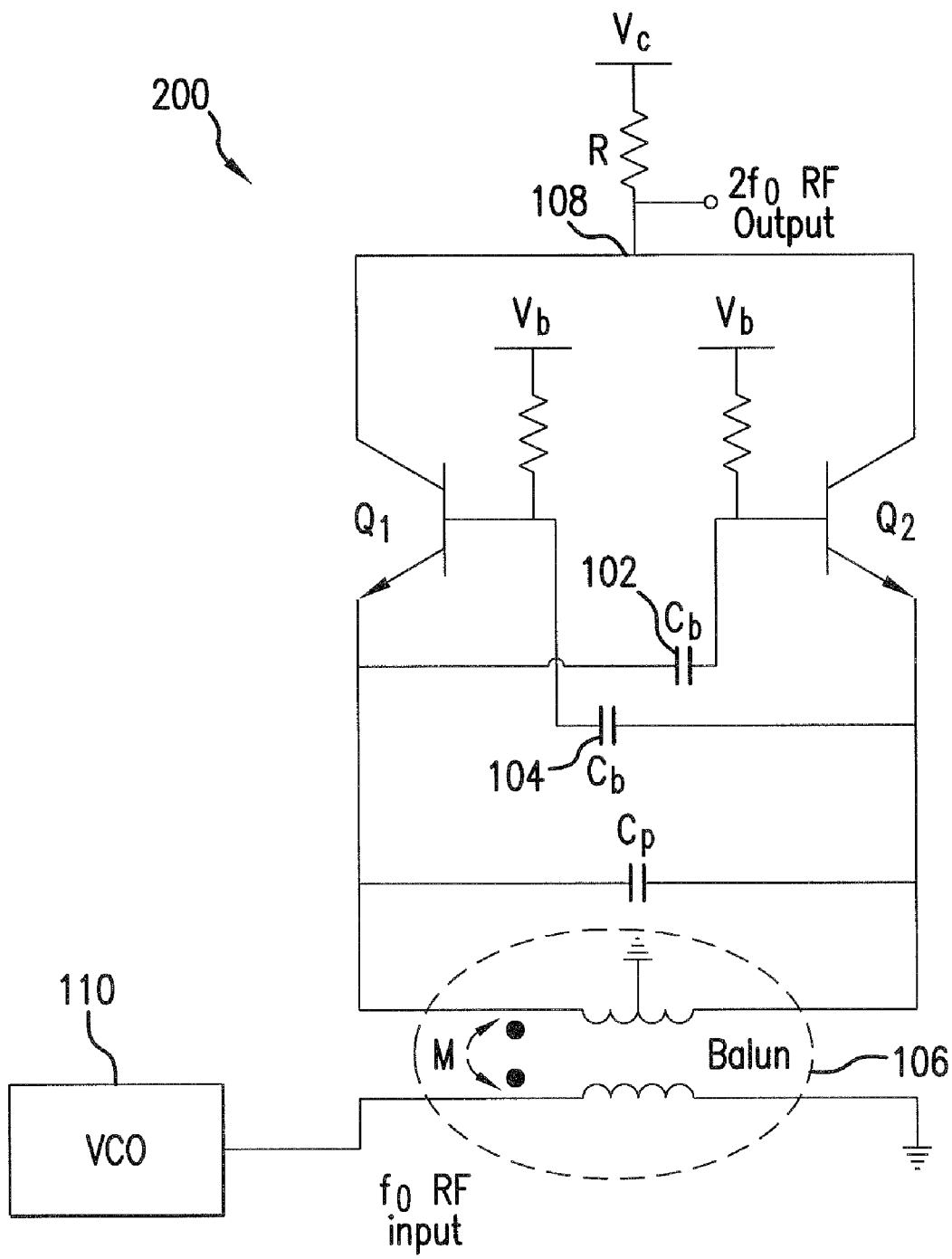
FIG. 2 is circuit diagram illustrating a frequency multiplier according to other embodiments of the invention.

Referring now to FIG. 2, FIG. 2 illustrates a frequency multiplier 200 according to some embodiments of the invention. Multiplier 200 is identical to multiplier 100, with the exception that a capacitor Cp has been added. By adding a parallel capacitor Cp across the passive balun, as shown in FIG. 2, the gain of multiplier becomes very flat.

In summary, advantages that may be realized by utilizing the multipliers described herein are: (1) a high conversion gain; (2) constant gain within certain range of RF input power; (3) broad RF bandwidth; (4) high frequency purity; (5) compact circuit; (6) low dc power consumptions, and (7) low dc supply voltage.

While the figures illustrate the use of BJTs for the transistors, multipliers 100 and 200 can be implemented in any semiconductor technology (e.g., CMOS, bipolar, Silicon, GaAs, etc). Multipliers 100 and 200 can be also implemented in discrete circuits.

Figure 3:
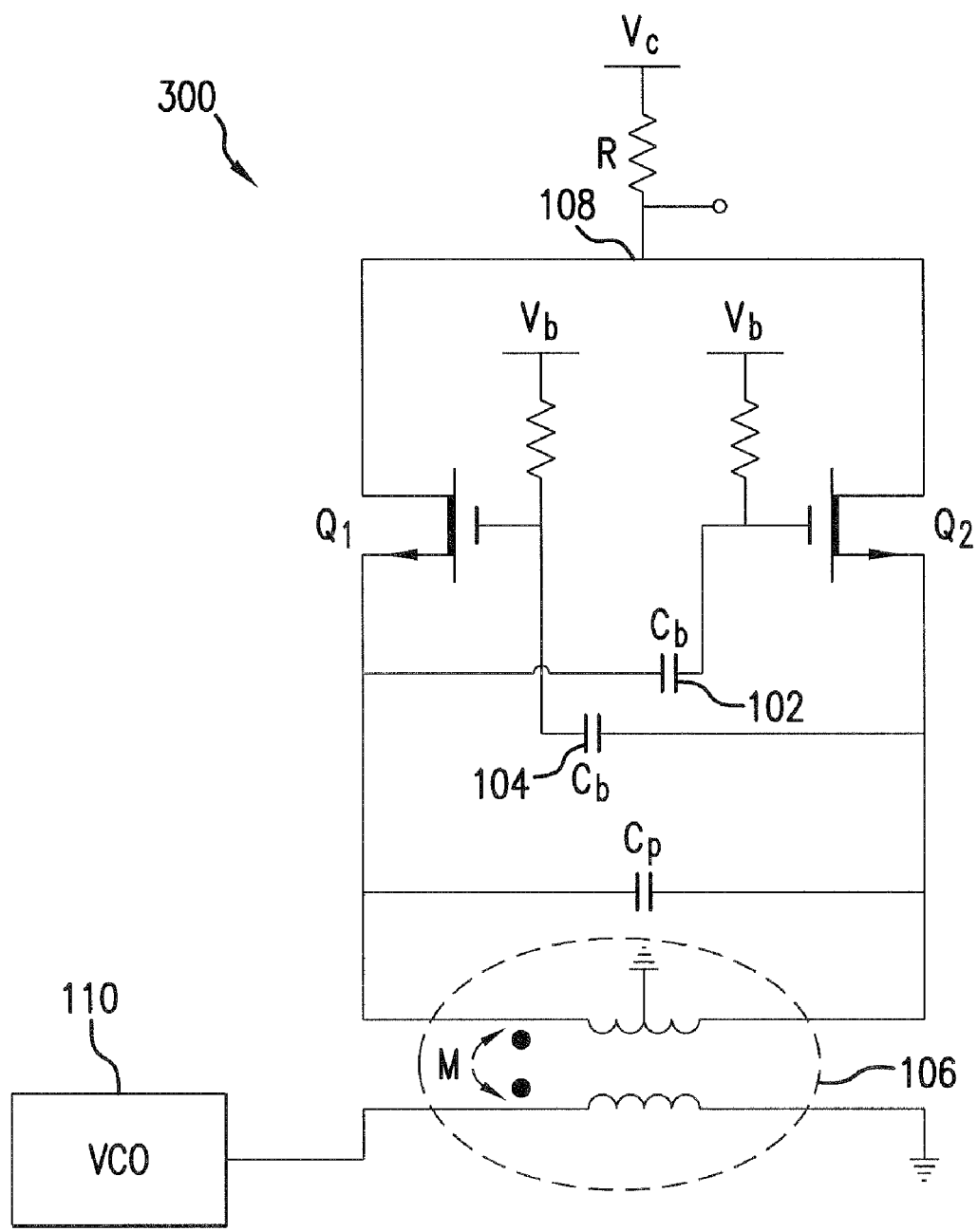
FIG. 3 is circuit diagram illustrating a frequency multiplier according to another embodiment of the invention.

For example, referring to FIG. 3, FIG. 3 illustrates a multiplier 300. Multiplier 300 is identical to multiplier 200 with the exception that the BJTs are replaced with MOSFETS. As shown in FIG. 3, frequency multiplier 300 includes passive balun 106 and a capacitive cross-coupled transistor pair (Q1 and Q2). For example, the gate of transistor Q1 is connected to the source of transistor Q2 via capacitor 104, and, likewise, the gate of transistor Q2 is connected to the source of transistor Q1 via capacitor 102. As further illustrated in FIG. 1, the drains of Q1 and Q2 are connected to output node 108 where a high frequency RF signal is taken out, and Q1's source and Q2's gate are connected with the balun's balanced output.

The multipliers described above can be used in any system requiring a relatively high frequency signal. For example, the multipliers can be used in high frequency radar system, high frequency transceivers, etc.

While various embodiments/variations of the present invention have been described above, it should be understood that they have been presented by way of example only, and not limitation. Thus, the breadth and scope of the present invention should not be limited by any of the above-described exemplary embodiments. Further, unless stated, none of the above embodiments are mutually exclusive. Thus, the present invention may include any combinations and/or integrations of the features of the various embodiments.

What is claimed is:

1. A frequency multiplier, comprising:
a first transistor (Q1) having a first terminal, a second terminal and a third terminal;
a second transistor (Q2) having a first terminal, a second terminal and a third terminal;
a voltage controlled oscillator (VCO) and
a balun comprising a first balanced terminal, a second balanced terminal and a third terminal, wherein
the first terminal of the first transistor is connected to the third terminal of the second transistor through one or more circuit elements, said one or more circuit elements including a first capacitor,
the first terminal of the second transistor is connected to the third terminal of the first transistor through one or more circuit elements, said one or more circuit elements including a second capacitor,
the third terminal of the first transistor is connected to the first balanced terminal of the balun,
the third terminal of the second transistor is connected to the second balanced terminal of the balun,
the second terminal of the first transistor is connected to an output node,
the second terminal of the second transistor is connected to the same output node, and
the vco is connected to the third terminal of the balun.

2. The frequency multiplier of claim 1, wherein the first transistor is a bipolar junction transistor (BJT) and the second transistor is a BJT, and wherein
the first terminal of the first transistor is the base of the first transistor, the first terminal of the second transistor is the base of the second transistor, the second terminal of the first transistor is the collector of the first transistor, the second terminal of the second transistor is the collector of the second transistor, the third terminal of the first transistor is the emitter of the first transistor, and the third terminal of the second transistor is the emitter of the second transistor.

3. The frequency multiplier of claim 1, wherein the first transistor is a field effect transistor and the second transistor is a field effect transistor, and wherein the first terminal of the first transistor is the gate of the first transistor, the first terminal of the second transistor is the gate of the second transistor, the second terminal of the first transistor is the drain of the first transistor, the second terminal of the second transistor is the drain of the second transistor, the third terminal of the first transistor is the source of the first transistor, and the third terminal of the second transistor is the source of the second transistor.

4. The frequency multiplier of claim 1, further comprising a third capacitor, wherein the third terminal of the first transistor is connected to the third terminal of the second transistor through the third capacitor.

5. The frequency multiplier of claim 1, wherein the first terminal of the first transistor and the first terminal of the second transistor are biased at a turn-on voltage.

6. A high frequency transceiver comprising the frequency multiplier according to claim 1.

7. A high frequency radar system comprising the frequency multiplier according to claim 1.

8. A high frequency radar system comprising the frequency multiplier according to claim 1.

9. A frequency multiplier, comprising:
a first transistor (Q1) having a first terminal, a second terminal and a third terminal;
a second transistor (Q2) having a first terminal, a second terminal and a third terminal;
a balun;
a first capacitor;
a second capacitor; and
a third capacitor, wherein the first terminal of the first transistor is connected to the third terminal of the second transistor through one or more circuit elements, said one or more circuit elements including the first capacitor, the first terminal of the second transistor is connected to the third terminal of the first transistor through one or more circuit elements, said one or more circuit elements including the second capacitor, the third terminal of the first transistor is connected to a first terminal of the balun, the third terminal of the second transistor is connected to a second terminal of the balun, the second terminal of the first transistor is connected to an output node, the second terminal of the second transistor is connected to the same output node, the third terminal of the first transistor is not directly connected to the third terminal of the second transistor, and the third terminal of the first transistor is connected to the third terminal of the second transistor through the third capacitor.

10. The frequency multiplier of claim 9, wherein the first transistor is a bipolar junction transistor (BJT) and the second transistor is a BJT, and wherein the first terminal of the first transistor is the base of the first transistor, the first terminal of the second transistor is the base of the second transistor, the second terminal of the first transistor is the collector of the first transistor, the second terminal of the second transistor is the collector of the second transistor, the third terminal of the first transistor is the emitter of the first transistor, and the third terminal of the second transistor is the emitter of the second transistor.

11. The frequency multiplier of claim 9, wherein the first transistor is a field effect transistor and the second transistor is a field effect transistor, and wherein the first terminal of the first transistor is the gate of the first transistor, the first terminal of the second transistor is the gate of the second transistor, the second terminal of the first transistor is the drain of the first transistor, the second terminal of the second transistor is the drain of the second transistor, the third terminal of the first transistor is the source of the first transistor, and the third terminal of the second transistor is the source of the second transistor.

12. The frequency multiplier of claim 9, wherein the first terminal of the first transistor and the first terminal of the second transistor are biased at a turn-on voltage.

13. A high frequency transceiver comprising the frequency multiplier according to claim 9.

* * * * *